United States Patent [19]
Yoshida et al.

[11] Patent Number: 5,751,198
[45] Date of Patent: May 12, 1998

[54] ANGULAR MODULATOR WITH A PHASE VARIATION DIVIDED AND INTEGRATED

[75] Inventors: Tatsumasa Yoshida; Ryoichi Miyamoto, both of Tokyo, Japan

[73] Assignee: Oki Electric Industry Co., Ltd., Tokyo, Japan

[21] Appl. No.: 755,016

[22] Filed: Nov. 22, 1996

[30] Foreign Application Priority Data

Nov. 24, 1995 [JP] Japan ................................. 7-305444

[51] Int. Cl.⁶ .......................... H03C 3/00; H04L 27/12; H04L 27/20
[52] U.S. Cl. ...................... 332/100; 332/103; 332/117; 332/144; 375/303; 375/308; 455/42; 455/110
[58] Field of Search .......................... 332/100, 102–105, 332/117, 144; 375/271, 279, 302–308; 455/42–45, 110

[56] References Cited

U.S. PATENT DOCUMENTS

| | | | |
|---|---|---|---|
| 4,562,414 | 12/1985 | Linder et al. | 332/117 |
| 5,091,705 | 2/1992 | Hiramatsu et al. | 332/103 |
| 5,224,119 | 6/1993 | Barabash et al. | 332/117 X |
| 5,412,352 | 5/1995 | Graham | 375/308 X |

FOREIGN PATENT DOCUMENTS 56-152359  11/1981  Japan .

OTHER PUBLICATIONS

"Communication Systems Engineering", p. 331, by J.G. Proakis, et al. Prentice Hall, 1994.

*Primary Examiner*—David Mis
*Attorney, Agent, or Firm*—Rabin, Champagne, & Lynt, P.C.

[57] ABSTRACT

A digital modulator capable of obtaining a high FM modulation index and reducing the quantization noise without increasing the sampling frequency of an A/D converter of input voice. A phase variation $\phi(Ts)$ of the digital data (Ts is the sampling period) produced on the basis of the output from the A/D converter is divided by a predetermined integer N (N>1) by a divider, and is fed to an integrator. The integrator integrates the divided phase variation $\phi(Ts)/N$ for every time interval Ts/N, thereby producing a phase component $\phi(t)$ of the complex envelope of the modulation signal. The phase component $\phi(t)$ is resolved into cosine and sine components at the time interval Ts/N. The cosine and sine signals are D/A converted into analog signals which are quadrature modulated by a quadrature modulator.

15 Claims, 8 Drawing Sheets

| Fig. 2 | |
|---|---|
| Fig. 2A | Fig. 2B |

WAVEFORMS OF D/A CONVERTER

VECTOR DIAGRAM

ANGULAR MODULATOR WITH A PHASE VARIATION DIVIDED AND INTEGRATED

BACKGROUND OF THE INVENTION

1. Field of the Invention

The present invention relates to a digital angular modulator for obtaining from an input analog or digital signal an angular-modulated signal, such as a frequency-modulated (FM modulated) signal, a frequency-shift keying (FSK modulated) signal, and a phase-shift keying (PSK modulated) signal.

2. Description of the Background Art

A digital FM modulator is disclosed in U.S. Pat. No. 5,091,705 to Hiramatsu et al. entitled "FM MODULATOR". Prior to the FM modulator, another type of digital FM modulator as shown in FIG. 1 was disclosed in Japanese patent laid-open publication No. 56-152359 (1981). The two types of FM modulator share an analog-to-digital (A/D) converter 5 and the main structure from an integrator 8 to digital-to-analog (D/A) converters 10 and a quadrature modulator 11. The chief difference between the two types is that although the Hiramatsu et al. FM modulator integrally performs the D/A conversion and the quadrature modulation, the FM modulator of '359 publication separately carries out the D/A conversion and the quadrature conversion.

In FIGS. 1A and 1B, an analog input signal (modulation signal) is converted into a digital signal by an A/D converter 5 at a sampling period Ts. The digital signal is fed through a digital waveform processor 6 to the integrator 8 which integrates the output of the digital waveform processor 6 to produce the phase component of the complex envelope of the modulation signal. The output of the integrator 8 is divided into quadrature (cosine and sine) components by a complex envelope generator 9. The cosine and sine components are D/A converted into analog signals by the D/A converters 10-1 and 10-2, and quadrature modulated by the quadrature modulator 11, thus generating an FM modulated signal. It is well known that an FM modulator can be structured by an integrator and a PM modulator (see, for example, page 331 of "COMMUNICATION SYSTEMS ENGINEERING", by J. G. Proakis, et al. Prentice Hall, 1994), and thus the quadrature modulator 11 functions as a PM modulator in this system. The more detailed structure and operation of the FM modulator will become apparent later in the description of embodiments.

The quadrature FM modulator has an advantage that it can achieve stable modulation index and produce an accurate FM signal without adjustment because it obtains the instantaneous phase of the modulation signal by the digital processing. In addition, the FM modulator is effective to obtain a quadrature phase-shift keying (QPSK modulated) signal with a single modulator by shifting the analog modulation signal or digital data by $\pi/4$.

The quadrature FM modulator as shown in FIGS. 1A and 1B, however, has the following problems:

(1) To reduce the sampling noise and quantization noise involved in the A/D conversion of the modulation signal by the A/D converter 5, the sampling frequency of the A/D converter 5 must be set higher to increase the bits of the quantization.

(2) In converting the digital signals representing the complex envelope output from the complex envelope generator 9 to the analog signals by the D/A converters 10-1 and 10-2, the phase variation of the complex envelope increases with the modulation factor. To reduce the error of the phase variation, the sampling frequency of the A/D converter 5 must be increased so as to decrease the instantaneous phase variation per sampling period.

SUMMARY OF THE INVENTION

It is therefore an object of the present invention to provide a digital angular modulator capable of reducing the sampling noise of the modulation signal, and obtaining a large angular modulation factor without unduly increasing the sampling frequency of an A/D converter used for converting an input voice signal (i.e. the modulation signal).

Another object of the present invention is to provide digital angular modulator which can obtain a highly reliable, angular modulated signal without increasing the sampling frequency when obtaining an FSK modulated signal with a fixed frequency shift by utilizing a quadrature FM modulator for modulating an input digital signal.

In a first aspect of the present invention, there is provided a digital angular modulator comprising: an input terminal for receiving an analog modulation signal; analog-to-digital (A/D) converting means for converting the analog modulation signal into a digital modulation signal every sampling period Ts; means for obtaining angle variation $\phi(Ts)$ per sampling period of the digital modulation signal; dividing means for dividing the angle variation by N, where N is an integer greater than one, to output a divided angle variation $\phi(Ts)/N$ every sampling period Ts; integrating means for integrating the divided angle variation $\phi(Ts)/N$ for every Ts/N interval; a carrier generator for generating a carrier signal; and modulation means for modulating the carrier signal by an output of the integrating means.

Here, the integrating means may comprise: holding means for holding the divided angle variation $\phi(Ts)/N$ output from the dividing means for the sampling period Ts to be output as a held data; a delay circuit for delaying an input signal by the time interval Ts/N; and an adder for adding N times the held data to an output of the delay circuit every Ts/N time interval, and for supplying an addition result to an input of the delay circuit.

The modulating means may comprise: complex envelope signal generating means for resolving the output of the integrating means into a cosine signal and a sine signal, and for generating a complex envelope signal by digital-to-analog (D/A) converting the cosine signal and the sine signal at the time interval Ts/N; and a quadrature modulator for quadrature modulating the carrier signal by the cosine signal and sine signal to produce an angular modulated signal.

In a second aspect of the present invention, the foregoing digital angular modulator may further comprise: an input terminal for receiving a digital signal; angle variation generating means for generating anangle variation designating signal by deciding logic levels of the digital signal and by defining angle variation amounts per time interval Ts/N, where Ts is a sampling period and N is an integer greater than one, in accordance with the logic levels and in correspondence with a predetermined angle deviation; and switching means for supplying the integrating means with one of outputs of the dividing means and the angle variation generating means.

In a third aspect of the present invention, there is provided a digital angular modulator comprising: an input terminal for receiving a digital signal; angle variation generating means for generating an angle variation designating signal by deciding logic levels of the digital signal and by defining angle variation amounts per time interval Ts/N, where Ts is a sampling period and N is an integer greater than one, in accordance with the logic levels and in correspondence with a predetermined angle deviation; integrating means for integrating the angle variation designating signal for every Ts/N interval; a carrier generator for generating a carrier signal; and modulation means for modulating the carrier signal by an output of the integrating means.

According to the first aspect of the present invention, the integrating means and the modulation means operates at the time interval Ts/N. This makes it possible to increase the apparent sampling frequency by a factor of N to N/Ts. This also makes it possible to reduce the sampling noise of the modulation signal, and to obtain a large modulation factor, by using the A/D converting means with a reasonable sampling frequency. In addition, the present invention is implemented by adding a divider and with a modification of the integrator, and hence an increase in the digital processing amount is limited to a minimum.

According to the second aspect of the present invention, a high-quality angular modulated signal can be obtained for both the analog and digital signals.

According to the third aspect of the present invention, digital FSK, for example, is achieved with a simple digital waveform generating circuit because the angle variation in the time interval Ts/N is determined at a fixed value, that is, at 1/N of the frequency deviation per sampling period Ts, in correspondence with the logic level "1" or "0". The angle variation is handled in the same manner as in the first aspect. This makes it possible to obtain a reliable FSK modulated signal without unduly increasing the sampling frequency of the modulation signal for the same reason described above.

BRIEF DESCRIPTION OF THE DRAWINGS

The objects and features of the present invention will become more apparent from consideration of the following detailed description taken in conjunction with the accompanying drawings in which:

FIG. 1 shows how

FIGS. 1A and 1B, when combined as shown in FIG. 1, are a schematic block diagram showing a conventional digital FM modulator;

FIG. 2 shows how

FIGS. 2A and 2B, when combined as shown in FIG. 2, are a schematic block diagram showing an embodiment of a digital FM modulator in accordance with the present invention;

FIG. 4 shows how

FIGS. 4A and 4B, when combined as shown in FIG. 4, are a schematic block diagram showing an alternative embodiment of a digital FM modulator in accordance with the present invention.

DESCRIPTION OF THE PREFERRED EMBODIMENTS

The invention will now be described with reference to the accompanying drawings.

Figure 1A:
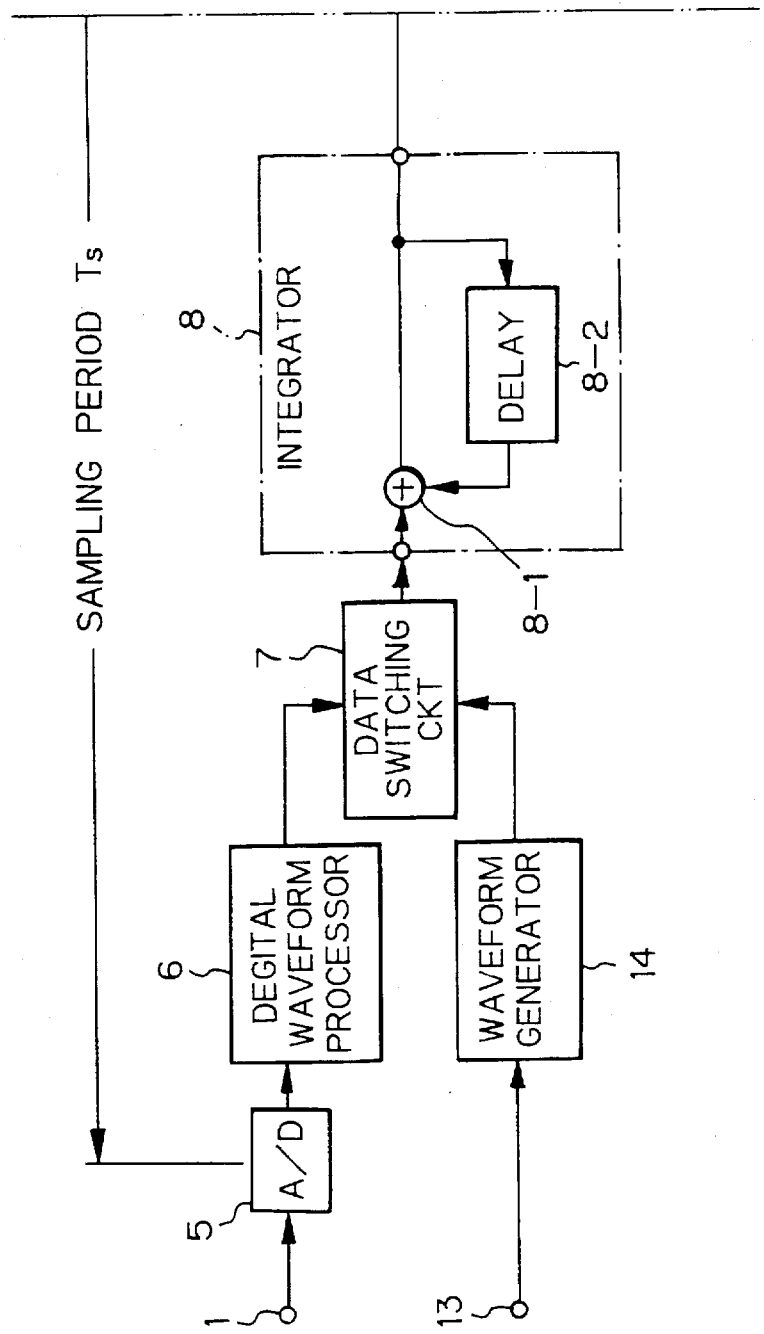
FIGS. 1A and 1B are combined.
Figure 1B:
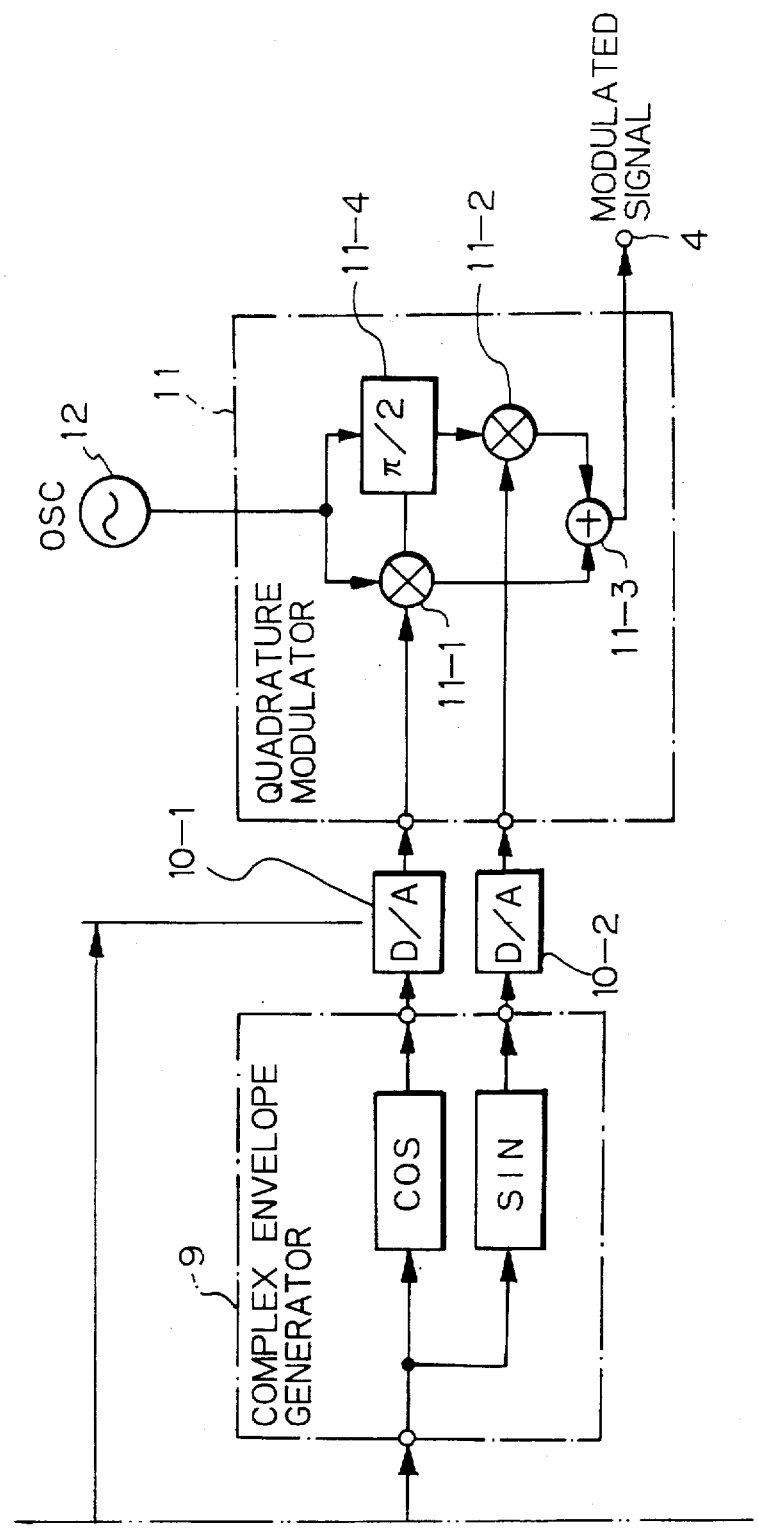
Figure 2A:
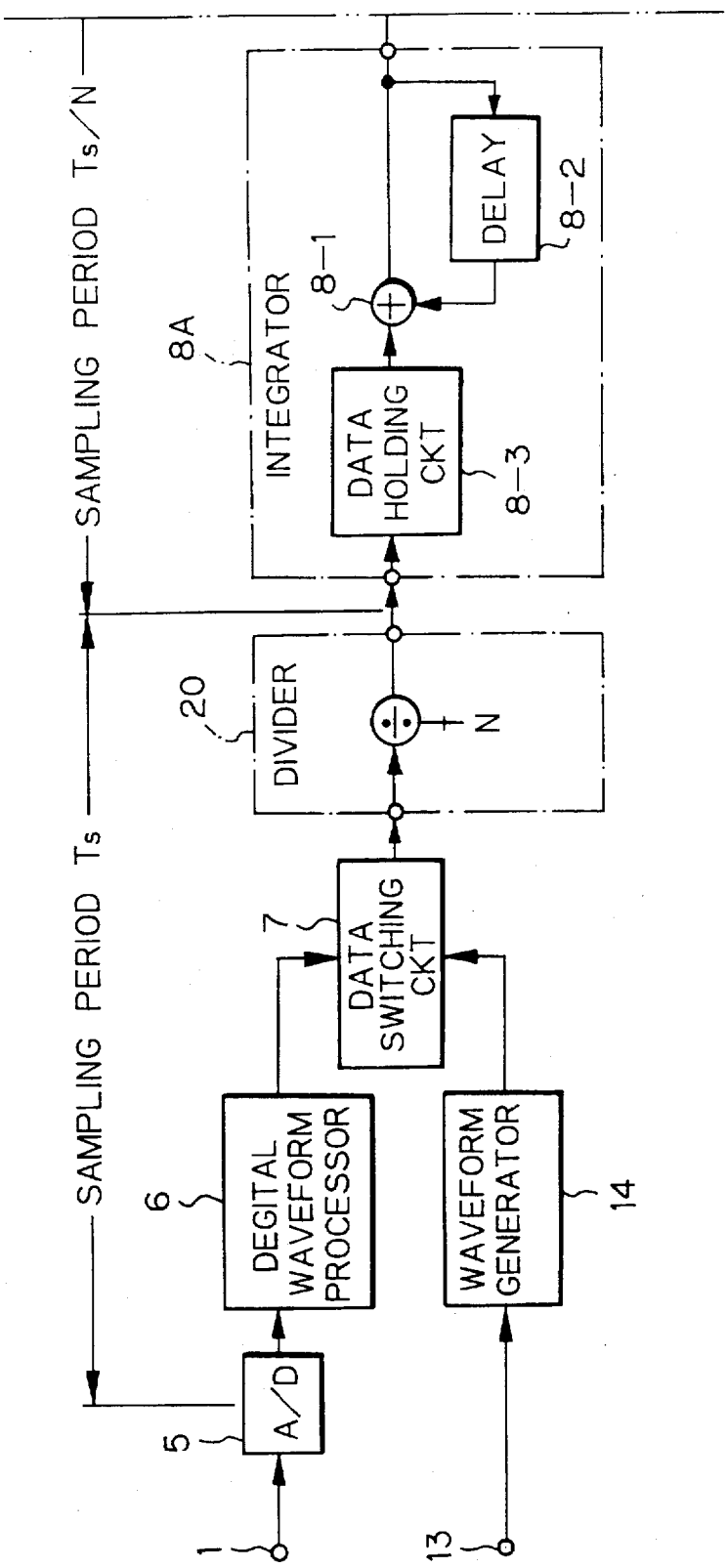
FIGS. 2A and 2B are combined.
Figure 2B:
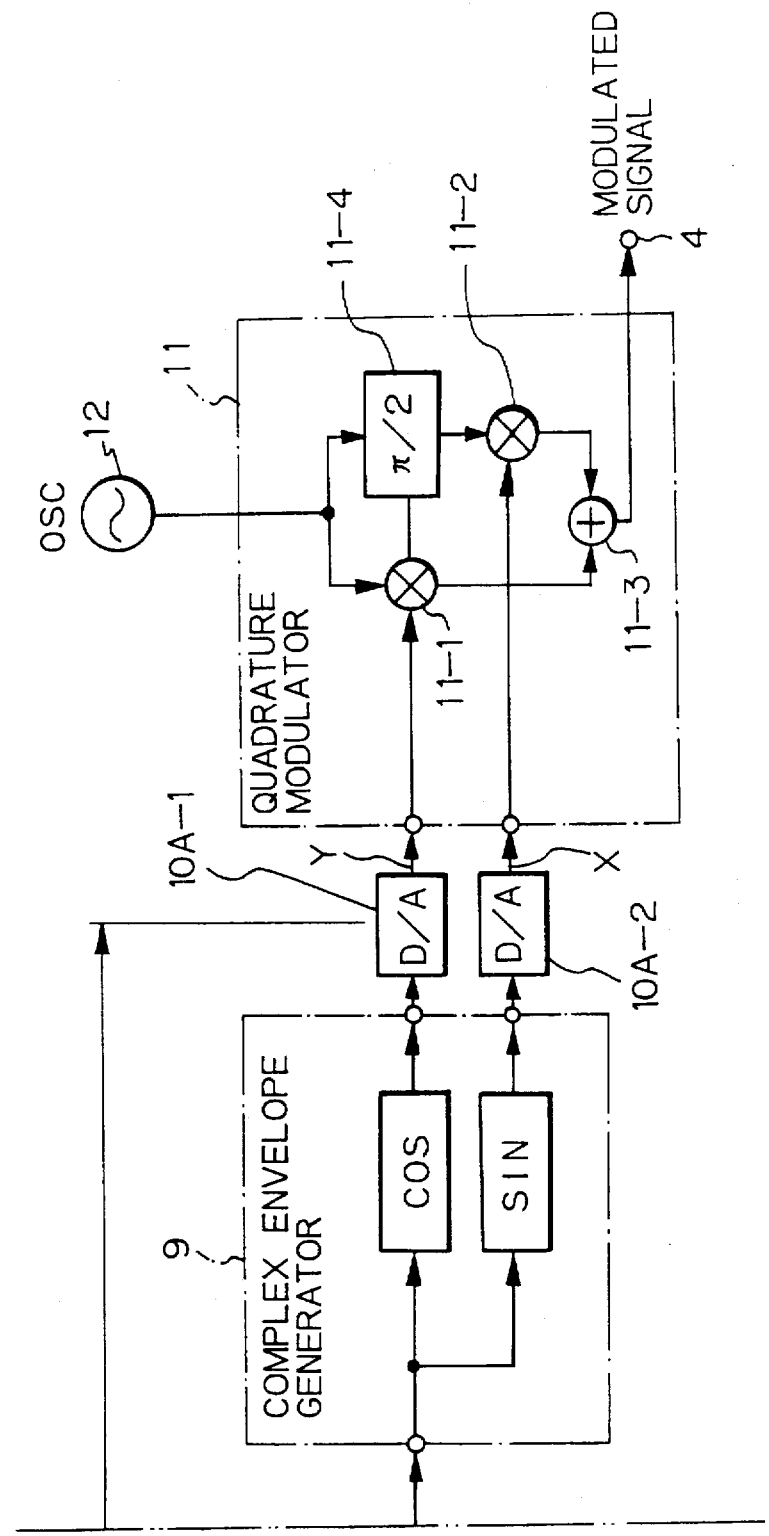

Referring to FIGS. 2A and 2B, an embodiment of a digital FM modulator in accordance with the present invention primarily differs from the conventional FM modulator shown in FIGS. 1A and 1B in that it comprises a divider 20 for dividing the output of the digital waveform processor 6 by N, where N is an integer greater than one, and a data holding circuit 8-3 for holding the divided digital data for a sampling period Ts. Furthermore, it differs in that its sampling frequency is increased by a factor of N from 1/Ts to N/Ts, from an integrator 8A to D/A converters 10A-1 and 10A-2.

The details of the embodiment will now be described. In FIG. 2A, an analog message signal (referred to as a modulation signal) applied to an input terminal 1 is converted into digital data by the A/D converter 5 at a sampling frequency 1/Ts, and is input to the digital waveform processor 6. The digital waveform processor 6 performs waveform processing of the digital data, such as band limiting, compression and expansion, differential operation, and amplitude limiting. The processed data, which represents a phase variation (more precisely, angular variation) $\phi(Ts)$ per sampling period Ts of the complex envelope of the modulation signal, is fed to a divider 20 through a data switching circuit 7 for selecting the analog or digital data.

The divider 20 divides the phase variation $\phi(Ts)$ of the complex envelope of the modulation signal by an integer N, which means that the phase variation $\phi(Ts)$ per sampling period Ts is reduced by a factor of N. The divided phase variation $\phi(Ts)/N$ is fed to an integrator 8A, and is held by a data holding circuit 8-3 for the sampling period Ts. The integrator 8A integrates the phase variation $\phi(Ts)/N$ at a time interval Ts/N using an adder 8-1 and a delay circuit 8-2. Specifically, the delay circuit 8-2 delays the output of the adder 8-1 by the interval Ts/N, and the adder 8-1 adds the output of the delay circuit 8-2 to the phase variation $\phi(Ts)$ in the data holding circuit 8-3, thereby outputting the integrated phase variation (that is, the phase component of the complex envelope of the modulation signal) $\phi(t)$ at each time interval Ts/N.

The phase component $\phi(t)$ of the complex envelope of the modulation signal is fed to a complex envelope generator 9 which resolves the phase component $\phi(t)$ into its cosine component and a sine component. The cosine and sine components are fed to D/A converters 10A-1 and 10A-2 for converting the digital input signals into corresponding analog signals. The D/A converters 10A-1 and 10A-2 operate at the increased sampling frequency N/Ts, and supply the analog signals to the quadrature modulator 11. The quadrature modulator 11 includes multipliers 11-1 and 11-2, an adder 11-3 and a 90-degree phase shifter 11-4, and is provided with the carrier from a carrier oscillator 12. The one multiplier 11-1 multiplies the carrier by the cosine component of the phase component $\phi(t)$ fed from the D/A converter 10A-1, and the other multiplier 11-2 multiplies the 90-degree phase shifted carrier by the sine component of the phase component $\phi(t)$ fed from the D/A converter 10A-2. The adder adds the outputs of the multipliers 11-1 and 11-2, thereby outputting the FM modulated signal from an output terminal 4.

Figure 3B:
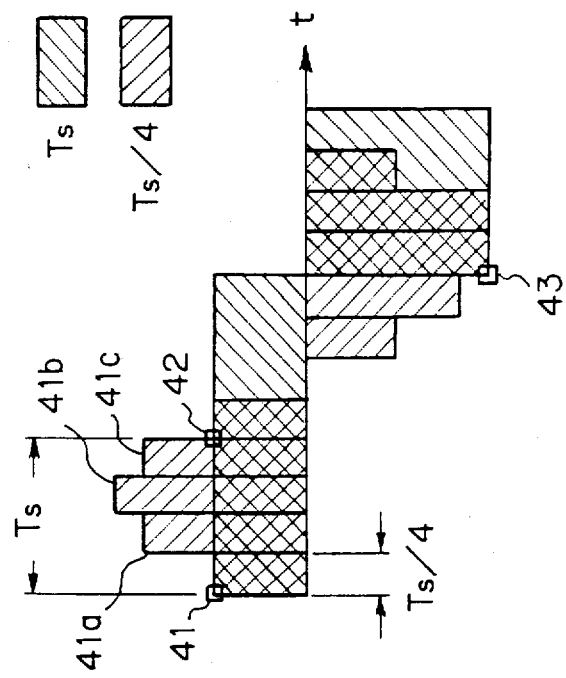
FIG. 3B shows a waveform of the output from a D/A converter of the embodiment in comparison with that of the conventional FM modulator.
Figure 3A:
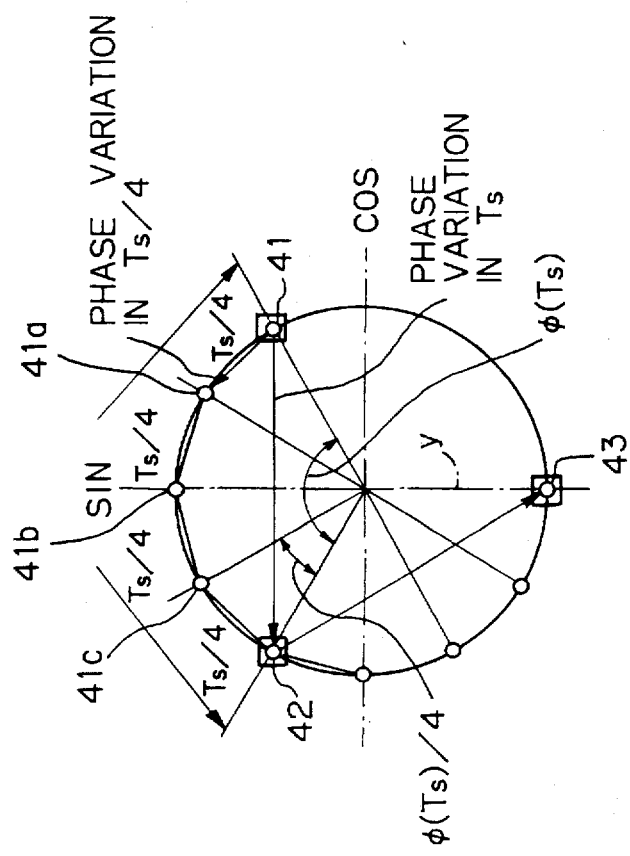
FIG. 3A is a vector diagram illustrating the locus of the complex envelope of the modulation signal of the embodiment shown in FIGS. 2A and 2B in comparison with that of the conventional FM modulator.

FIG. 3A is a vector diagram useful for understanding the operation of the integrator 8A. In the vector diagram, the circle represents the locus of the phase component $\phi(t)$ of the complex envelope of the modulation signal, and N is the divisor which is set at four in this case. Reference numerals 41–43 denote the phase variation of the modulation signal in the conventional system, whereas reference numerals 41a–41c denote the phase variation in the present embodiment.

In the conventional FM modulator operation, represented by the points 41–43 in FIG. 3A, the phase variation φ(Ts) increases with the modulation index, and the vector locus falls into deep into the vector circle during transition from point 41 to 42, and from point 42 to 43 as illustrated in FIG. 3A. Thus, the error of the phase variation will increase unless the sampling interval Ts of the A/D converter 5 is increased in the conventional FM modulator.

In contrast with this, the phase variation φ(Ts) is divided by an integer N in the present invention, and the resultant phase variation φ(Ts)/N shifts along lines close to the locus represented by the points 41 and 41a–41c at every Ts/N interval. Thus, the sampling frequency 1/Ts is increased to N/Ts from the integrator 8A to the D/A converters 10A-1 and 10A-2, and this prevents the vector locus from falling into deep inside the vector circle as in the conventional FM modulator.

FIG. 3B exemplarily represents the output signal of the D/A converter 10A-1 or 10A-2. In this figure, the cosine (or sine) signal of the present invention represented by 41 and 41a–41c has a waveform much smoother than the waveform of the conventional FM modulator denoted by 41–43. This means that FM modulator in accordance with the present invention can achieve FM modulation more accurately than the conventional FM modulator.

The operation will now be further described using equations. The digital waveform processor 6 outputs the phase variation φ(Ts) per sampling period Ts of the complex envelope of the modulation signal. The divider 20 divides the phase variation φ(Ts) by the integer N, thereby outputting φ(Ts)/N. The data holding circuit 8-3 holds the divided phase variation φ(Ts)/N for the sampling period Ts. The delay circuit 8-2 outputs the sum total of the phase variations φ(Ts) from the start of the operation to the preceding time tp=(t−Ts)+Its/N, where t is the present time and i is an integer varying from zero to N. Thus, the output of the delay circuit can be expressed as $\Sigma\phi(ti)$. The adder 8-1 adds the divided phase variation φ(Ts)/N to the output of the delay circuit 8-2, thereby outputting the phase component of the complex envelope of the modulation signal, which is expressed as $\Sigma\phi(tp)+i\phi(Ts)/N$. The output of the adder 8-1 is fed to the complex envelope generator 9 as the output of the integrator 8A. The complex envelope generator 9 generates the cosine signal and sine signal of the input signal at every Ts/N time interval. The D/A converters 10A-1 and 10A-2 converts the cosine and sine signals into analog signals which are input to the quadrature modulator 11. The above operation is repeated N times until the integer i reaches N, at which the phase component φ(t) is obtained.

The quadrature modulator 11 modulates the carrier signal cos(2π fct) and its 90-degree phase shifted signal sine(2π fct) by the cosine and sine signal output from the D/A converters every Ts/N time interval as follows:

$$Efm = \cos(2\pi fct)\cos(\phi(t)) - \sin(2\pi fct)\sin(\phi(t))$$
$$= \cos(2\pi fct + \phi(t))$$

Thus, the FM modulated signal is produced from the quadrature modulator 11 every Ts/N time interval.

The analog modulation signal input to the input terminal 1 is processed as described above. On the other hand, a digital modulation signal input to a digital input terminal 13 is fed to the data switching circuit 7 through a waveform generating circuit 14 including a Gaussian filter, for example. The data switching circuit 7 selects one of the digital modulation signals fed from the digital waveform processor 6 and the waveform generating circuit 14, and supplies the selected signal to the divider 20. The operation after the divider 20 is the same as the above-described operation. This enables the phase variation φ(Ts)/N to shift without falling deep inside the circle, which means that the error of the phase variation can be restricted to a small amount because the sampling frequency is increased to N/Ts after the integrator 8A. Thus, the present embodiment can achieve highly accurate FM modulation without increasing the sampling frequency of the A/D converter 5.

According to the embodiment described above, the phase variation φ(Ts) of the complex envelope of the modulation signal obtained at every sampling period Ts is reduced by a factor of N, thus being produced as the divided phase variation φ(Ts)/N. The divided phase variation φ(Ts)/N is added N times at Ts/N interval by the integrator 8A, resulting in the phase component φ(t) of the complex envelope of the modulation signal. The phase component φ(t) is D/A converted at the time interval Ts/N. Thus, the output of the divider is processed at the time interval Ts/N, which corresponds to increasing the sampling frequency to N/Ts from Ts from the integrator 8A to the D/A converters 10A-1 and 10A-2.

In a conventional quadrature FM modulator, a method is known which performs interpolation of the digital data produced from the A/D converter as a technique to increase the sampling frequency of the D/A converters while limiting the sampling frequency to a low value. This method, however, requires a lowpass filter for removing the aliasing frequencies caused by the interpolation, and hence increases the digital processing load per sampling period.

By contrast with this, the embodiment can limit an increase in the digital processing load to a minimum amount by obtaining the phase component of the complex envelope of the modulation signal by reducing the phase variation per sampling period by a factor of N, and by integrating the reduced phase variation with the integrator with a simple structure.

The processing performed from the A/D converter 5 to the D/A converters 10A-1 and 10A-2 can advantageously be implemented by a digital signal processor (DSP), or the divider 20 and the following circuits can be replaced by corresponding logic circuits so that the processing associated with the sampling frequency N/Ts is removed from the DSP.

The divisor N of the divider 20 should be decided optimally in accordance with the performance required by the digital FM modulator. Increasing the divisor N results in the reduction in the phase variation φ(Ts), and in the shift along the locus close to the circle as illustrated in FIG. 3A, thereby implementing smooth, small step frequency deviation. This, however, increases the load and delay in processing. By contrast, decreasing the divisor N will reduce the processing load and delay at the cost of the smooth, small step frequency deviation.

According to the embodiment of the present invention, a highly reliable and accurate quadrature FM modulated signal can be obtained without unduly increasing the sampling frequency of the analog modulation signal, such as a voice signal. This makes it possible to reduce the processing amount of the digital signal processor. In addition, since the logic circuit can be easily implemented by an integrated circuit (IC), the FM modulator in accordance with the present invention can contribute to the reduction in size and consumption power of mobile radio devices or the like. For example, it can be preferably applied to portable telephones used in the AMPS (Advanced Mobile Phone Service). Specifically, it can achieve the FM modulation of wideband data, such as FACCH (fast associated control channel) or SACCH (slow associated control channel) with a bandwidth of about 10 kHz applied to the digital input terminal 13, or the voice signal applied to the analog input terminal 1.

Figure 4A:
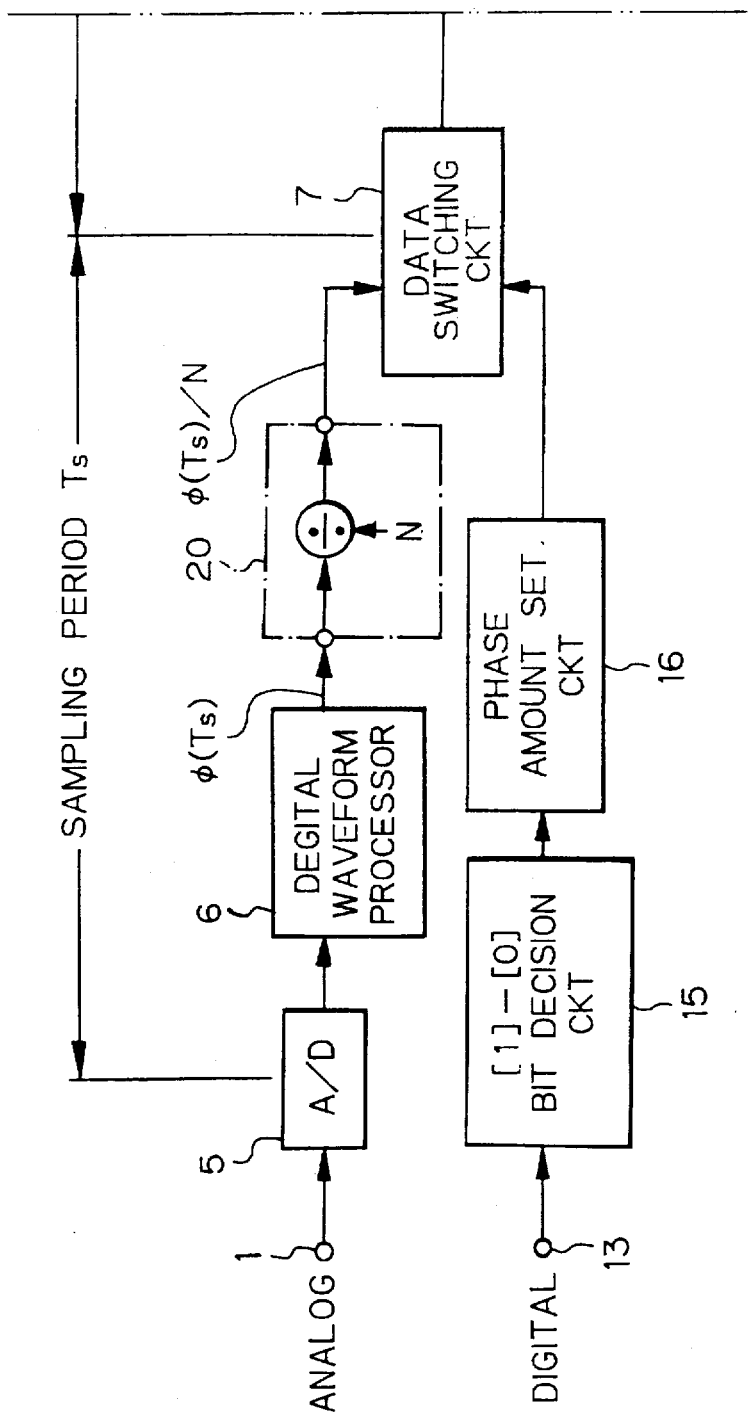
FIGS. 4A and 4B are combined.
Figure 4B:
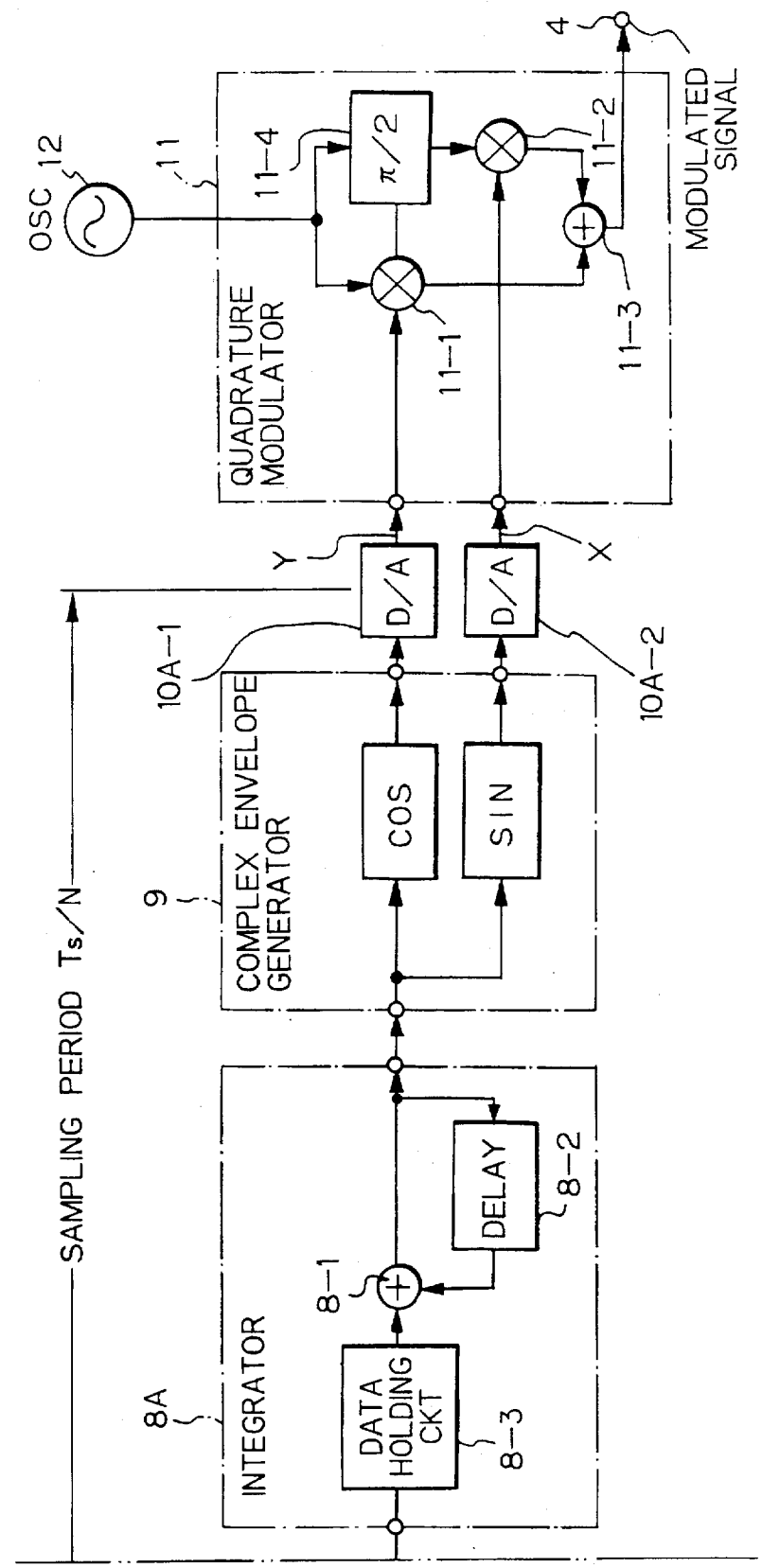

Referring to FIGS. 4A and 4B, an alternative embodiment of the digital FM modulator in accordance with the present invention mainly differs from the first embodiment in the following:

(1) The divider 20 is connected to the input of the data switching circuit 7 rather than to the output thereof. More specifically, the divider 20 is connected between the digital waveform processor 6 and the data switching circuit 7. This is because the phase shift of the digital input data is decided independently of the analog data as described below.

(2) The digital input signal applied to the input terminal 13 is processed through a bit decision circuit 15 and a phase amount set circuit 16, so that the phase shift amount of FSK (Frequency Shift Keying) is output corresponding to "1" and "0" of the digital data. For example, the phase amount set circuit 15 outputs $+\pi/N$ for "1" and $-\pi/N$ for "0" of the input digital data.

Figure 5:
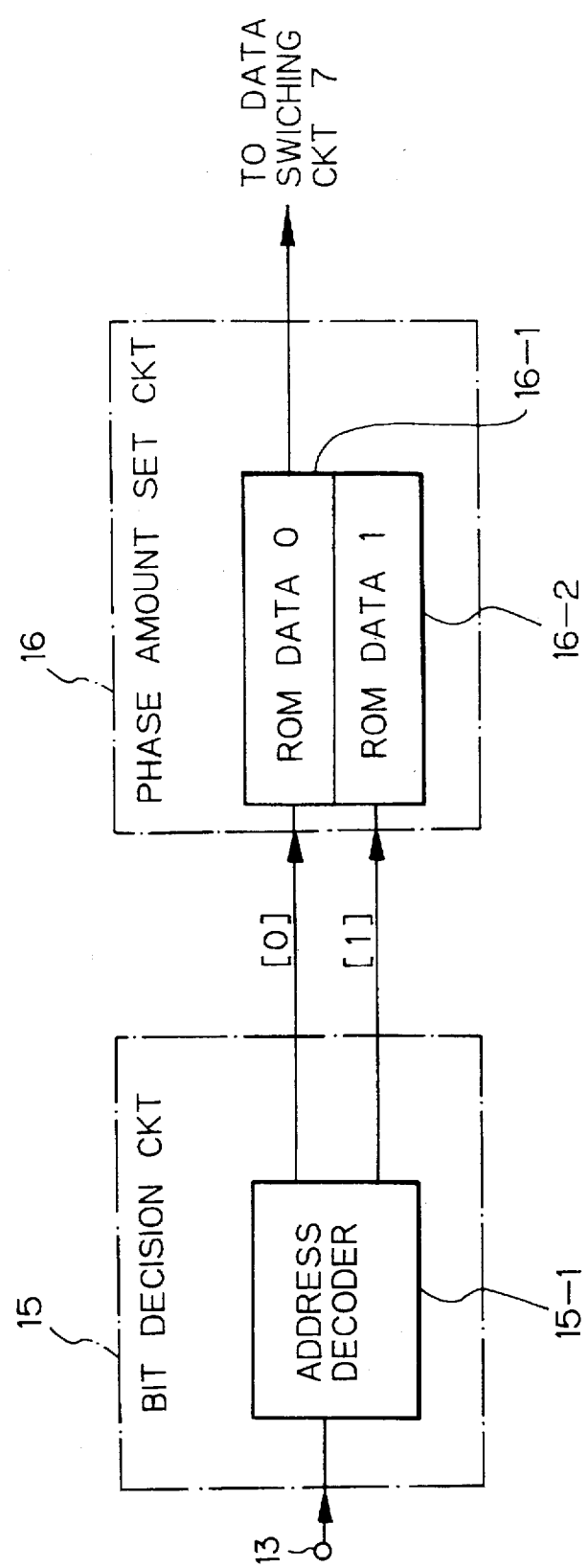
FIG. 5 is a schematic block diagram showing a bit decision circuit and a phase amount set circuit included in the embodiment shown in FIGS. 4A and 4B.

FIG. 5 schematically shows the bit decision circuit 15 and the phase amount set circuit 16 together with the circuitry associated therewith. The bit decision circuit 15 includes an address decoder 15-1 for deciding "1" and "0" of the digital input data at a data rate, and for outputting pointers representing 1 and 0 in accordance with the bit data "1" and "0" of the input digital signal. The phase amount set circuit 16 includes ROM data 16-1 and 16-2 for producing the phase variations corresponding to the pointers "0" and "1", and outputs a phase variation designating signal representing a phase variation of a frequency deviation per time interval Ts/N, where N is an integer greater than one. The phase variation is predetermined in accordance with the logic levels "0" and "1" of the digital signal, and hence the phase shift amount of the FSK is determined to a fixed value by the phase amount set circuit 16. The phase amount is fed to the integrator 8A via the data switching circuit 7.

In the second embodiment, when the digital input data is selected by the switching circuit 7, FSK is carried out. In this case, since the phase amount set circuit 16 generates the phase amount corresponding to 1/N of the phase shift amount of the FSK, an FSK modulated signal output from the output terminal 4 is smoother and more accurate than what would be obtained by the conventional FM modulator.

Although the two embodiments are described in connection with the quadrature FM modulator, the present invention can also be applied to a PSK (Phase Shift Keying) modulator, MSK (Minimum Shift Keying) modulator, or GMSK (Gaussian Filtered MSK) modulator. Thus, the present invention includes a wide range of digital FM modulators and PM modulators, which are generically referred to as "angular modulators".

As the A/D converter 5, a non-linear A/D converter can be used as well as a linear one.

While the present invention has been described with reference to the particular illustrative embodiments, it is not to be restricted by those embodiments. It is to be appreciated that those skilled in the art can change or modify the embodiments without departing from the scope and spirit of the present invention.

What is claimed is:

1. A digital angular modulator comprising:

an input terminal for receiving an analog modulation signal;

analog-to-digital (A/D) converting means for converting said analog modulation signal into a digital modulation signal every sampling period Ts;

means for obtaining angle variation $\phi(Ts)$ per sampling period of the digital modulation signal;

dividing means for dividing the angle variation by N, where N is an integer greater than one, to output a divided angle variation $\phi(Ts)/N$ every sampling period Ts;

integrating means for integrating the divided angle variation $\phi(Ts)/N$ for every Ts/N interval;

a carrier generator for generating a carrier signal; and modulation means for modulating said carrier signal by an output of said integrating means.

2. The modulator as claimed in claim 1, wherein said integrating means comprises:

holding means for holding the divided angle variation $\phi(Ts)/N$ output from said dividing means for the sampling period Ts to be output as a held data;

a delay circuit for delaying an input signal by the time interval Ts/N; and an adder for adding N times said held data to an output of said delay circuit every Ts/N time interval, and for supplying an addition result to an input of said delay circuit.

3. The modulator as claimed in claim 2, wherein said modulating means comprises:

complex envelope signal generating means for resolving the output of said integrating means into a cosine signal and a sine signal, and for generating a complex envelope signal by digital-to-analog (D/A) converting said cosine signal and said sine signal at the time interval Ts/N; and a quadrature modulator for quadrature modulating said carrier signal by said cosine signal and sine signal to produce an angular modulated signal.

4. The modulator as claimed in claim 1, wherein said modulator is a digital FM modulator.

5. The modulator as claimed in claim 1, wherein said modulator is a digital PM modulator.

6. The modulator as claimed in claim 1, further comprising:

an additional input terminal for receiving a digital signal;

angle variation generating means for generating an angle variation designating signal by deciding logic levels of said digital signal and by defining angle variation amounts per time interval Ts/N, where Ts is a sampling period and N is an integer greater than one, in accordance with the logic levels and in correspondence with a predetermined angle deviation; and switching means for supplying said integrating means with one of outputs of said dividing means and said angle variation generating means.

7. The modulator as claimed in claim 6, wherein said integrating means comprises:

holding means for holding the angle variation designating signal output from said angle variation generating means for the sampling period Ts to be output as a held data;

a delay circuit for delaying an input signal by the time interval Ts/N; and an adder for adding N times said held data to an output of said delay circuit every Ts/N time interval, and for supplying an addition result to an input of said delay circuit.

8. The modulator as claimed in claim 7, wherein said modulating means comprises:

complex envelope signal generating means for resolving the output of said integrating means into a cosine signal and a sine signal, and for generating a complex envelope signal by digital-to-analog (D/A) converting said cosine signal and said sine signal at the time interval Ts/N; and a quadrature modulator for quadrature modulating said carrier signal by said cosine signal and sine signal to produce an angular modulated signal.

9. The modulator as claimed in claim 6, wherein said modulator is a digital FM modulator.

10. The modulator as claimed in claim 6, wherein said modulator is a digital PM modulator.

11. A digital angular modulator comprising:

an input terminal for receiving a digital signal;

angle variation generating means for generating an angle variation designating signal by deciding logic levels of said digital signal and by defining angle variation amounts per time interval Ts/N, where Ts is a sampling period and N is an integer greater than one, in accordance with the logic levels and in correspondence with a predetermined angle deviation;

integrating means for integrating the angle variation designating signal for every Ts/N interval;

a carrier generator for generating a carrier signal; and modulation means for modulating said carrier signal by an output of said integrating means.

12. The modulator as claimed in claim 11, wherein said integrating means comprises:

holding means for holding the angle variation designating signal output from said angle variation generating means for the sampling period Ts to be output as a held data;

a delay circuit for delaying an input signal by the time interval Ts/N; and an adder for adding N times said held data to an output of said delay circuit every Ts/N time interval, and for supplying an addition result to an input of said delay circuit.

13. The modulator as claimed in claim 12, wherein said modulating means comprises:

complex envelope signal generating means for resolving the output of said integrating means into a cosine signal and a sine signal, and for generating a complex envelope signal by digital-to-analog (D/A) converting said cosine signal and said sine signal at the time interval Ts/N; and a quadrature modulator for quadrature modulating said carrier signal by said cosine signal and sine signal to produce an angular modulated signal.

14. The modulator as claimed in claim 11, wherein said modulator is a digital FM modulator.

15. The modulator as claimed in claim 11, wherein said modulator is a digital PM modulator.

\* \* \* \* \*